(12) United States Patent
Coughlin et al.

(10) Patent No.: US 11,602,776 B2
(45) Date of Patent: Mar. 14, 2023

(54) SONIC CLEANING SYSTEM AND METHOD OF SONIC CLEANING A WORKPIECE

(71) Applicant: Applied Materials, Inc., Santa Clara, CA (US)

(72) Inventors: Michael J. Coughlin, San Jose, CA (US); Jianqi Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/735,489

(22) Filed: Jan. 6, 2020

(65) Prior Publication Data
US 2020/0230661 A1    Jul. 23, 2020

Related U.S. Application Data

(60) Provisional application No. 62/794,689, filed on Jan. 20, 2019.

(51) Int. Cl.
  *B08B 3/12* (2006.01)
  *B08B 3/08* (2006.01)
  *H01L 21/67* (2006.01)

(52) U.S. Cl.
  CPC ........... *B08B 3/12* (2013.01); *B08B 3/08* (2013.01); *H01L 21/67057* (2013.01)

(58) Field of Classification Search
  None
  See application file for complete search history.

(56) References Cited

U.S. PATENT DOCUMENTS

| | | | | |
|---|---|---|---|---|
| 2,702,260 A | * | 2/1955 | Massa | C25D 5/20 134/1 |
| 2,987,068 A | * | 6/1961 | Branson | B08B 3/12 134/184 |
| 3,520,724 A | * | 7/1970 | Massa | B08B 3/12 134/1 |
| 4,224,110 A | * | 9/1980 | McCord | C23G 5/04 202/169 |

(Continued)

FOREIGN PATENT DOCUMENTS

| | | |
|---|---|---|
| CN | 102639752 A | 8/2012 |
| EP | 2508649 A1 | 10/2012 |

(Continued)

OTHER PUBLICATIONS

International Search Report and Written Opinion of the International Searching Authority for PCT/US2020/012375 dated Apr. 29, 2020, 12 pages.

(Continued)

*Primary Examiner* — Eric W Golightly
*Assistant Examiner* — Arlyn I. Rivera-Cordero
(74) *Attorney, Agent, or Firm* — Patterson + Sheridan, LLP

(57) ABSTRACT

In some embodiments, a sonic cleaning system includes a tank configured to receive a liquid that enables propagation of sonic waves and a cylindrical insert located within the tank. The cylindrical insert includes a first end having a first opening and a second end opposite the first end. The second end has a second opening. The cylindrical insert is configured to suspend a workpiece between the first opening and the second opening. The sonic cleaning system includes a sonic transducer located within the cylindrical insert.

19 Claims, 3 Drawing Sheets

(56) References Cited

U.S. PATENT DOCUMENTS

| | | | | |
|---|---|---|---|---|
| 4,525,219 | A | * | 6/1985 | Jones .................... B08B 3/12 134/1 |
| 4,618,263 | A | * | 10/1986 | McCord .................. B08B 3/12 134/184 |
| 6,102,056 | A | | 8/2000 | Kotsopey |
| 2005/0061355 | A1 | | 3/2005 | Berman et al. |
| 2007/0215177 | A1 | | 9/2007 | Uchino |
| 2009/0241987 | A1 | * | 10/2009 | Serizawa ................ A61L 2/18 134/1 |
| 2012/0240956 | A1 | * | 9/2012 | Nishimoto ............. C23G 3/021 134/1 |
| 2014/0102493 | A1 | | 4/2014 | Kuo |
| 2017/0330771 | A1 | | 11/2017 | Wang |

FOREIGN PATENT DOCUMENTS

| | | |
|---|---|---|
| JP | H08197022 A | 8/1996 |
| JP | 2005349380 A | 12/2005 |
| JP | 2009240544 A | 10/2009 |
| JP | 4369887 B2 | 11/2009 |
| JP | 3202764 U | 2/2016 |
| JP | 2017202469 A | 11/2017 |
| WO | 2006007639 A1 | 1/2006 |
| WO | 2011067955 A1 | 6/2011 |

OTHER PUBLICATIONS

Office Action from CN Patent Application No. 202080009826.8 dated Jun. 28, 2022, 14 pages.

Extended European Search Report for EP 20741499.6 dated Sep. 9, 2022, 8 pages.

Japanese Office Action dated Oct. 4, 2022 for Application No. 2021-540475, pp. 8.

Search Report and Written Opinion from SG 11202106840T dated Dec. 13, 2022, 9 Pages.

Chinese Office Action for Application No. 202080009826.8 dated Nov. 29, 2022, 10 Pages.

* cited by examiner

SONIC CLEANING SYSTEM AND METHOD OF SONIC CLEANING A WORKPIECE

CROSS-REFERENCE TO RELATED APPLICATIONS

This application claims benefit of U.S. Provisional Patent Application No. 62/794,689, filed Jan. 20, 2019, which is herein incorporated by reference in its entirety.

BACKGROUND

Field

Embodiments of the disclosure relate to an apparatus and a method and, more specifically, a sonic cleaning system and a method of sonic cleaning a workpiece.

Description of the Related Art

Workpieces used in the semiconductor industry, such as processing chamber components and the like, often require frequent cleaning in order to remove particles and otherwise unwanted material from the workpieces. For example, workpieces can be contaminated during deposition of thin films on a substrate in a processing chamber. For example, contaminants can fall onto substrates being processed in the processing chamber, and can cause defects in the eventual devices formed during the substrate processing.

Sonic cleaning systems include tanks for cleaning such workpieces are filled with a liquid. High frequency sound waves are generated via a transducer and propagate through the liquid to a workpiece located in the tank. The sound waves cause cavitation proximate the workpiece, which releases particles, such as dirt and grease, from the workpiece.

One drawback with sonic cleaning systems in the art is that sonic waves are not properly focused on the workpieces during cleaning. In traditional sonic cleaning systems, ultrasonic and/or megasonic waves generated by the transducer are attenuated by corners of the tank in which the transducer is located. For example, the corners of the tanks disperse or otherwise attenuate the ultrasonic and/or megasonic waves generated by the ultrasonic transducers. In addition, traditional sonic cleaning systems have tanks that are much larger than workpieces located therein. In these tanks, the ultrasonic and/or megasonic waves are dispersed through the large tanks and are not sufficiently focused on the workpieces. Accordingly, the energy generated by the ultrasonic transducers in traditional sonic cleaning systems are not efficiently delivered to the workpiece and sonic cleaning is inefficient.

Therefore, what is needed in the art is apparatuses and methods with improved focus of sonic waves on workpieces.

SUMMARY

Embodiments herein include apparatuses and methods for sonic cleaning. The apparatuses and methods improve the focusing of sonic waves on workpieces, resulting in improved cleaning of the workpieces.

In one embodiment, a sonic cleaning system is provided. The sonic cleaning system includes a tank configured to contain a liquid that enables propagation of sonic waves and an insert disposed within the tank. The insert includes a first end having a first opening and a second end opposite the first end. The second end has a second opening. The insert is configured to receive a workpiece between the first opening and the second opening. The sonic cleaning system further includes a sonic transducer disposed next to the second opening.

In another embodiment, a method of sonic cleaning a workpiece is provided. The method includes filling a tank with a liquid, wherein the tank includes a sonic transducer and an insert, placing the workpiece in the insert, and activating the sonic transducer.

In yet another embodiment, a sonic cleaning system is provided. The sonic cleaning system includes a tank configured to contain a liquid that enables propagation of sonic waves and an insert disposed within the tank. The insert includes a first end having a first opening and a second end opposite the first end. The second end has a second opening. The insert is configured to receive a workpiece between the first opening and the second opening, and the insert is cylindrical. The sonic cleaning system further includes a sonic transducer located within the cylindrical insert.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein generally relate to a sonic cleaning system and a method of sonic cleaning a workpiece. The sonic cleaning system includes one or more tanks filled with a liquid, wherein high frequency waves (e.g., sound waves) propagate through the liquid. One or more workpieces that are to be cleaned are placed into the liquid. High frequency sound waves are generated, such as by an ultrasonic transducer, and propagate through the liquid to the workpieces. The sound waves cause cavitation proximate the workpieces, which releases particles, such as dirt and grease, from the workpieces. Corners of the tanks may attenuate or disperse the sound waves, which prevents the energy in the sound waves from reaching the workpieces, resulting in inefficient cleaning of the workpieces.

As used herein, the term "about" refers to a +/−10% variation from the nominal value. It is to be understood that such a variation can be included in any value provided herein.

Figure 1:
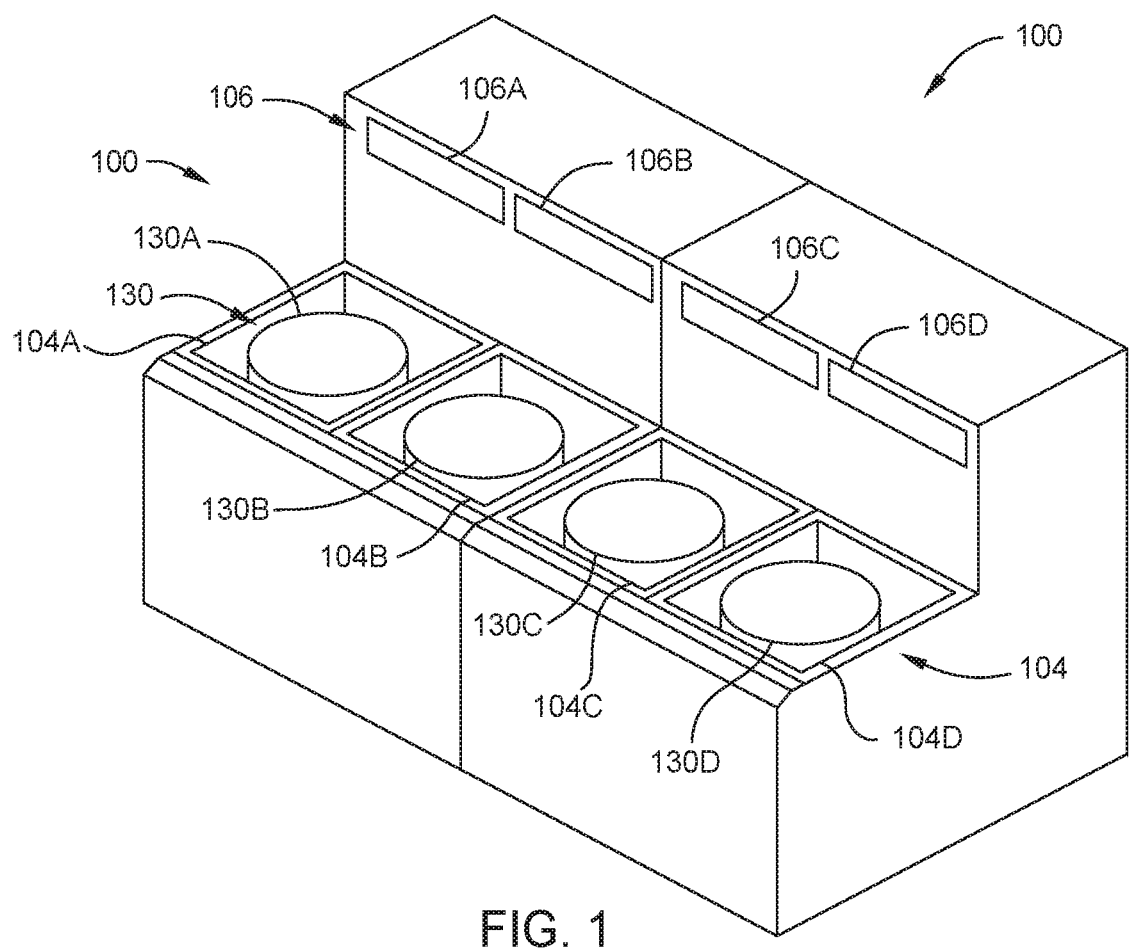
FIG. 1 illustrates an isometric view of a sonic cleaning system, according to one embodiment.

FIG. 1 illustrates an isometric view of an sonic cleaning system 100, according to one embodiment. As shown, the sonic cleaning system 100 includes one or more tanks 104. The sonic cleaning system 100 illustrated in FIG. 1 includes four tanks 104, which are referred to individually as tanks 104A-104D. Although four tanks 104A-104D are illustrated in FIG. 1, the sonic cleaning system 100 can include any number of tanks 104. Each of the tanks 104 can be at least a portion of an individual sonic cleaning system. The tanks 104 can be isolated from one another. Each of the tanks 104 can be individually filled with a liquid, such as deionized water, that enables propagation of ultrasonic and/or megasonic sound waves. In some embodiments, the liquid includes one or more solvents, cleaning solutions such as standard clean 1 (SC-1) and/or ammonia hydroxide ($NH_4OH$) and/or hydrogen peroxide ($H_2O_2$), selective deposition removal reagents (SDR), surfactants, acids, bases, or any other chemicals useful for removing contaminants and/or particulates from a workpiece. Examples of workpieces are components for wafer fabrication equipment.

The sonic cleaning system 100 includes one or more power supplies 106. For example, each of the tanks 104 may be associated with one of the power supplies 106. As illustrated in FIG. 1, the sonic cleaning system 100 includes four power supplies 106, referred to individually as power supplies 106A-106D. Each individual tank 104A-104D can be associated with one of the individual power supplies 106A-106D. Fewer or more power supplies may be used. As described in greater detail below, the power supplies 106 can supply radio frequency (RF) power to transducers (not shown in FIG. 1) located in the tanks 104.

Figure 2:
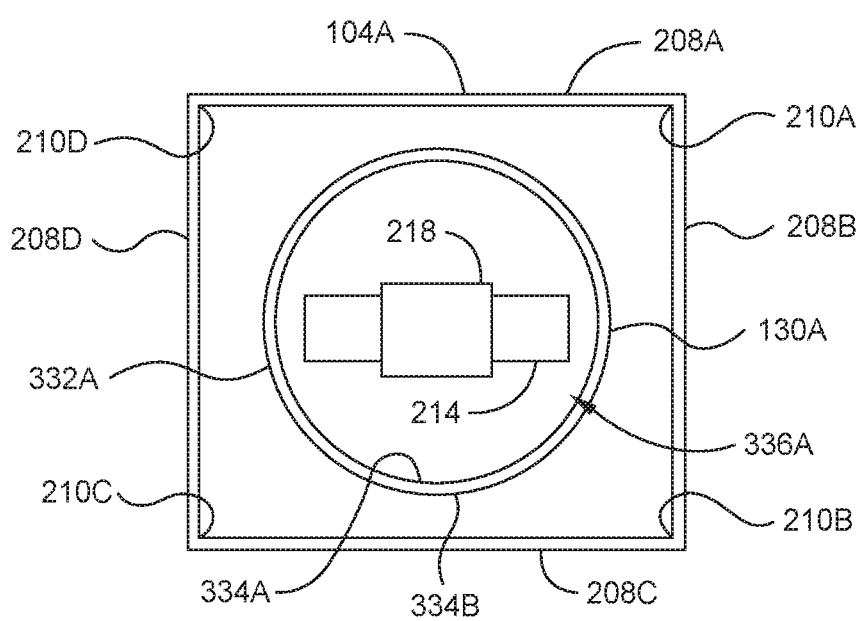
FIG. 2 illustrates a top plan view of a tank, according to one embodiment.

FIG. 2 illustrates a top plan view of the tank 104A, according to one embodiment. The tank 104A includes walls 208, such as four walls 208A-208D. The tank 104 can be square or rectangular when viewed from the top as illustrated in FIG. 2. Square and rectangular tanks are easy to manufacture because flat sheets of material forming the walls 208A-208D can be fastened (e.g., welded) together to form the tank 104A. The walls 208A-208D can include rigid materials, such as stainless steel or other metals. Other materials can be used in the walls 208A-208D. Square and rectangular tanks 104 also provide structural integrity and can be easily incorporated into larger structures, such as frames and the like (not shown) that hold and/or support the square and/or rectangular tanks 104. Square and rectangular tanks 104 can further include weirs (not shown), such as adjustable weirs, that provide overflow from the tanks 104. The tanks 104 can have other shapes including any number of sides, such as three sides, five-sides, and six-sides.

The walls 208A-208D intersect at corners 210A-210D. Other embodiments of the tanks 104 can include different shapes having walls (e.g., flat walls) that form corners. For example, the tanks 104 include five or six sides wherein at least some of the sides form corners.

A sonic transducer 214, is located within the tank 104A. The sonic transducer 214 is configured to emit ultrasonic and/or megasonic waves into the liquid in the tank 104A to facilitate cleaning of a workpiece 218. The sonic transducer 214 can include piezoelectric actuators or any other suitable mechanisms that generate vibrations at ultrasonic and/or megasonic frequencies of a specific amplitude. The sonic transducer 214 can be a single transducer or can include an array of transducers. The sonic transducer 214 is oriented to direct ultrasonic energy to a location where the workpiece 218 is positioned. In some embodiments, the sonic transducer 214 is configured to direct ultrasonic and/or megasonic waves in a direction normal to an edge of the workpiece 218, or at an angle relative to the normal direction. In some embodiments, the sonic transducer 214 is dimensioned to be approximately equal in length to a mean or outer diameter or dimension of the workpiece 218. In other embodiments, the sonic transducer 214 has a length greater than the length of the workpiece 218. Power is applied to the transducer by the power supply 106A. For example, RF power is supplied to the ultrasonic transducer by the power supply 106A.

In traditional sonic cleaning systems, ultrasonic and/or megasonic waves generated by the transducer are attenuated by corners of the tank in which the transducer is located. For example, the corners of the tanks disperse or otherwise attenuate the ultrasonic and/or megasonic waves generated by the ultrasonic transducers. In addition, traditional sonic cleaning systems have tanks that are much larger than workpieces located therein. In these tanks, the ultrasonic and/or megasonic waves are dispersed through the large tanks and are not sufficiently focused on the workpieces. Accordingly, the energy generated by the ultrasonic transducers in traditional sonic cleaning systems are not efficiently delivered to the workpiece and sonic cleaning is inefficient.

The sonic cleaning system 100 disclosed herein can overcome the deficiencies of conventional sonic cleaning systems by including inserts 130 (e.g., cylindrical or otherwise-shaped inserts) in the tanks 104. One or more workpieces (e.g., workpiece 218) are located within the inserts 130. In some embodiments, one or more of the tanks 104 include an insert 130, and one or more of the tanks 104 do not include an insert. As illustrated in FIG. 1, all of the tanks 104 include inserts 130, which are referred to individually as inserts 130A-130D. As described in greater detail below, the inserts 130 reflect waves emitted by the sonic transducer 214, so the energy generated by the sonic transducer 214 remains near the workpiece 218. For example, the waves generated by the sonic transducer 214 (FIG. 2) are not substantially attenuated by the corners 210A-210D of the tank 104A or dispersed through the whole volume of the tank 104A.

Figure 3:
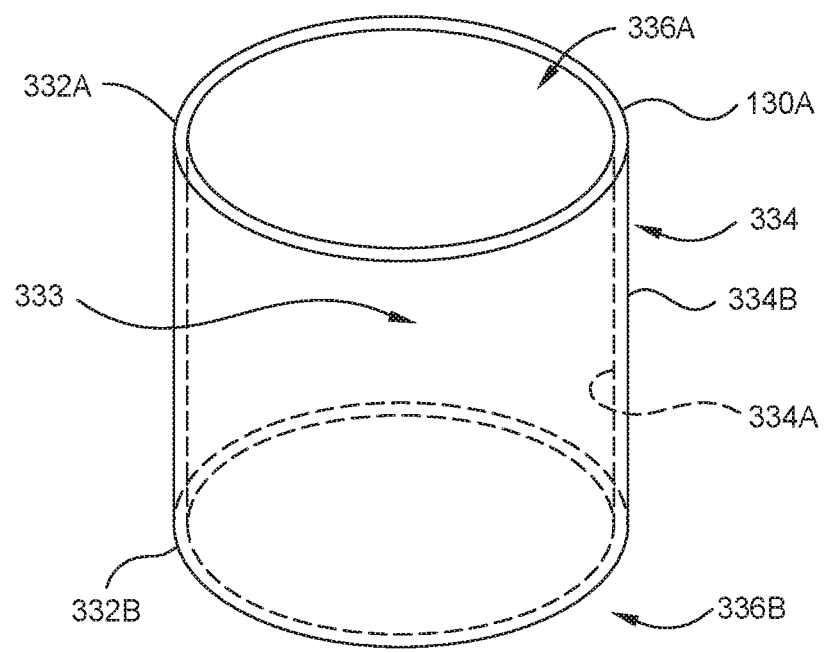
FIG. 3 illustrates an isometric view of an insert of the tank in FIG. 2, according to one embodiment.

FIG. 3 illustrates an isometric view of the insert 130A, according to one embodiment. In some embodiments, the insert 130A includes a rigid material, such as a metal. In some embodiments, the insert 130A includes aluminum, titanium, stainless steel, and/or alloy materials, that reflect and/or focus sound waves propagating in a liquid in a tank. The insert 130A can include other materials, such as flexible materials. The materials used in the insert 130A are compatible with liquids in the tank 104A (i.e., the materials of the insert are not substantially corroded or otherwise chemically altered by the liquids). In the embodiment illustrated in FIG. 3, the insert 130A is cylindrical. The cylindrical shape focuses and/or reflects the ultrasonic and/or megasonic waves to the workpiece 218. However, other shapes of the insert 130A are contemplated, such as polygonal shaped inserts. In the embodiment illustrated in FIG. 3, the insert 130A is in the form of a sleeve that encircles the workpiece 218. However, it is contemplated that the workpiece 210 can be placed outside the insert 130A. In some embodiments, the walls of the insert 130A are solid.

As illustrated in FIG. 3, the insert 130A includes a first end 332A (e.g., a top end) and an opposite second end 332B (e.g., a bottom end). A wall 334 extends between the first end 332A and the second end 332B. The wall 334 includes an inner surface 334A and an outer surface 334B. The insert 130A includes a first opening 336A (e.g., a top opening) located proximate the first end 332A and an opposite second opening 336B (e.g., a bottom opening) located proximate the second end 332B. In some embodiments, both the first opening 336A and the second opening 336B are the same size. In some embodiments, a channel 333 extends across the insert 130A between the first end 332A and the second end 332B. The insert 130A is round or oval when viewed from the first end 332A, as illustrated in FIGS. 2 and 3. In other embodiments, the insert 130A has other shapes, including octagonal and hexagonal shapes, when viewed from the first end 332A.

Figure 4:
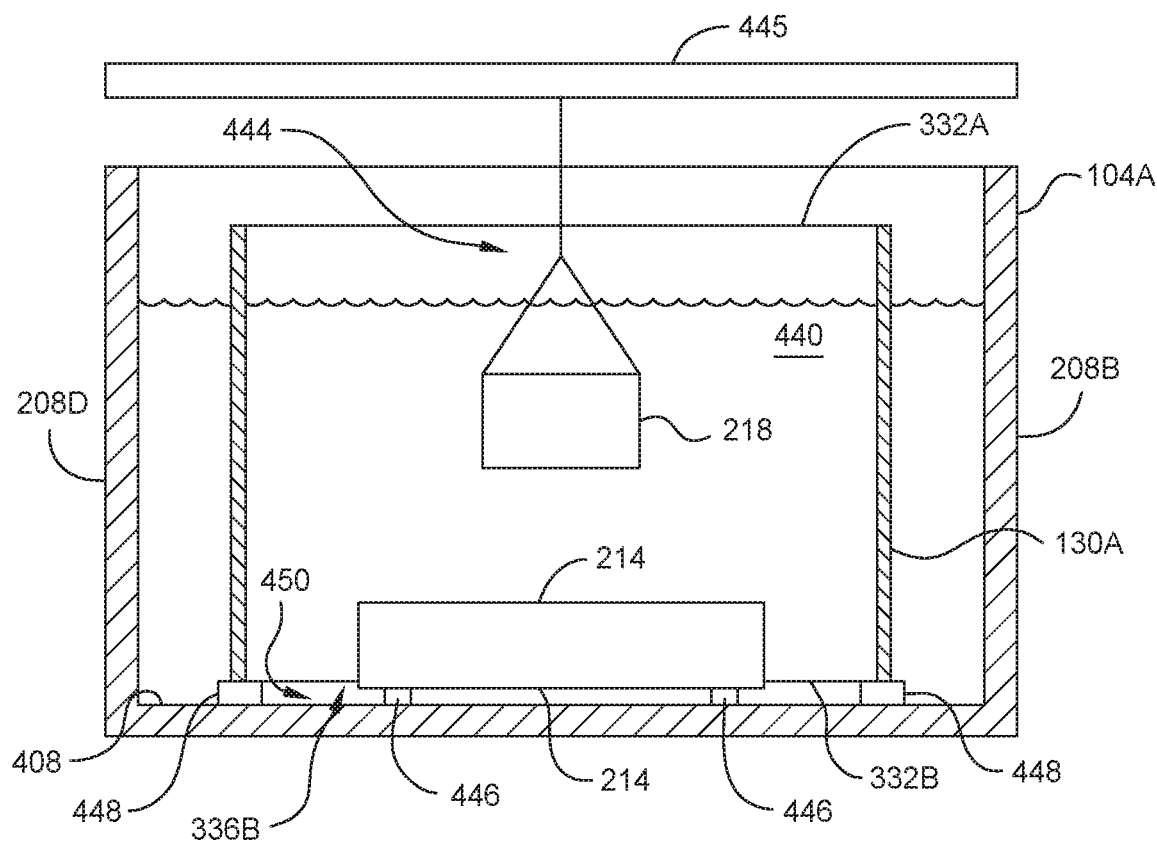
FIG. 4 illustrates a cross-sectioned view of a tank with an insert and a workpiece, according to one embodiment.

FIG. 4 illustrates a cross-sectioned view of the tank 104A with the insert 130A and the workpiece 218, according to one embodiment. As shown, the tank 104A includes a floor 408 that can support the insert 130A and the sonic transducer 214. The tank 104A is at least partially filled with a liquid 440. The liquid 440 enables ultrasonic and/or megasonic waves generated by the sonic transducer 214 to at least partially propagate throughout the liquid 440. In some embodiments, the liquid 440 includes deionized water. In some embodiments, the liquid 440 includes one or more solvents, a cleaning solution such as standard clean 1 (SC-1) and/or ammonia hydroxide ($NH_4OH$) and/or hydrogen peroxide ($H_2O_2$), selective deposition removal reagent (SDR), surfactants, acids, bases, or any other chemicals useful for removing contaminants and/or particulates from a workpiece. The tank 104A can be filled with other liquids. In some embodiments, the level of the liquid 440 is higher than the first end 332A of the insert 130A. In some embodiments, the level of the liquid 440 is lower than the first end 332A of the insert 130A, which keeps the waves within the insert 130A and improves cleaning of the workpiece 218. For example, the level of the liquid 440 is between about 2.54 cm and about 15.24 cm (between about 1.0 in and about 6.0 in) below the first end 332A of the insert 130A. In other embodiments, the level of the liquid 440 and the first end 332A are the same height.

As illustrated in FIGS. 2 and 4, the workpiece 218 is disposed within the insert 130A so as to be completely submerged and surrounded by the liquid 440. As illustrated in FIG. 4, the workpiece 218 is suspended within the insert 130A. For example, a cord 444 or similar device suspends the workpiece 218 within the insert 130A. The cord 444 is used in a generic sense and can include any combination of straps, ropes, chains, lines, and other flexible linkages. In some embodiments, the sonic cleaning system 100 includes a support 445, such as an overhead beam or similar support, to which the cord 444 is attached. The support 445 is, for example, a metal bar located at the top of tank 104A above the sonic transducer 214 and liquid 440. Accordingly, the support 445 and the cord 444 are configured to suspend the workpiece within the insert 130A. In other embodiments, other devices are employed to suspend the workpiece 218 within the insert 130A. In other embodiments, the workpiece 218 is not suspended within the insert 130A.

The workpiece 218 can be suspended so as to be located between the first end 332A and the second end 332B of the insert 130A. As such, the workpiece 218 is only in direct contact with the liquid 440 and the cord 444, and is not directly contacting other components such as the sonic transducer 214 or the insert 130A. Traditional sonic cleaning systems include racks or the like that support workpieces. These racks and the like attenuate or absorb energy transferred by the ultrasonic and/or megasonic waves. By suspending the workpiece 218 within the insert 130A, more energy transfers near the workpiece 218 to clean the workpiece 218 than with traditional sonic cleaning systems. For example, more energy in the form of ultrasonic and/or megasonic waves is available to cavitate liquid proximate the workpiece 218.

In some embodiments, the sonic transducer 214 is located at least partially within the insert 130A. For example, the sonic transducer 214 can be located proximate the second opening 336B, at least partially within the second opening 336B, at least partially within the insert 130A, or within the insert 130A. By locating the sonic transducer 214 at least partially within the second opening 336B and/or at least partially within the insert 130A, or within the insert 130A, the ultrasonic and/or megasonic waves emitted by the sonic transducer 214 propagate within the insert 130A and release energy proximate the workpiece 218. For example, ultrasonic and/or megasonic waves emitted by the sonic transducer 214 reflect off the inner surface 334A of the insert 130A toward the workpiece 218. Accordingly, the ultrasonic and/or megasonic waves generated by the sonic transducer 214 are not attenuated by the corners 210A-210D of tank 104A. Additionally, the ultrasonic and/or megasonic waves are not dispersed through the volume of the tank 104A located outside the insert 130A.

In some embodiments, transducer supports 446 are located between the floor 408 of the tank 104A and the sonic transducer 214. The transducer supports 446 raise the sonic transducer 214 a predetermined distance from the floor 408 to form a space between the sonic transducer 214 and the floor 408. For example, the transducer supports 446 raise the sonic transducer 214 so that the sonic transducer 214 is at least partially within the insert 130A and/or at least partially within the second opening 336B. The space between the sonic transducer 214 and the floor 408 can mechanically isolate the sonic transducer 214 from the walls 208A-208D and the floor 408 of the tank 104A. In some embodiments, the space between the floor 408 and the sonic transducer 214 is less than about 15.24 cm (about 6 in). Larger or smaller spacings can be used. In some embodiments, a portion of the ultrasonic transducer that emits ultrasonic and/or megasonic waves is higher than the second end 332B of the insert 130A, which maintains the waves within the insert 130A.

In some embodiments, insert supports 448 raise the second end 332B of the insert 130A from the floor 408. Raising the second end 332B from the floor 408 creates a space 450 between the second end 332B and the floor 408. The space 450 provides for the flow of the liquid 440 between the interior and the exterior of the insert 130A. The space 450 also isolates (e.g., mechanically isolate) the insert 130A from the walls 208A-208D and floor 408 of the tank 104A. In some embodiments, the space 450 is less than about 10.16 cm (about 4 in). In some embodiments, the space 450 is less than about 2.54 cm (about 1 in). In some embodiments, the space 450 is less than about 1.27 cm (0.5 in). In some embodiments, the second end 332B is located proximate and/or in contact with the floor 408.

During use of the sonic cleaning system 100, one or more of the tanks 104 is at least partially filled with the liquid 440 as described above. Referring to the operation of the tank 104A, the workpiece 218 can be suspended by the cord 444 or other device within the insert 130A. The sonic transducer 214 is activated and emits ultrasonic and/or megasonic waves within the liquid 440. Because the sonic transducer 214 is at least partially located within the insert 130A, most of the waves emitted by sonic transducer 214 remain within the insert 130A. For example, the waves are not substantially attenuated and/or dispersed by the corners 210A-210D of the tank 104A. In addition, the waves generated by the sonic transducer 214 reflect off the curved inner surface 334A of the insert 130A and toward the workpiece 218. Accordingly, more energy is transferred near the workpiece 218 than with traditional sonic cleaning systems, resulting in more cavitation than with traditional sonic cleaning systems.

In addition to the foregoing, the workpiece 218 can be suspended within the insert 130A, as illustrated in FIG. 4. Therefore, racks and other devices that may attenuate and/or disperse waves generated by the sonic transducer 214 are not located within the insert 130A. The result is more cavitation near the workpiece 218, and thus improved cleaning of the workpiece.

Figure 5:
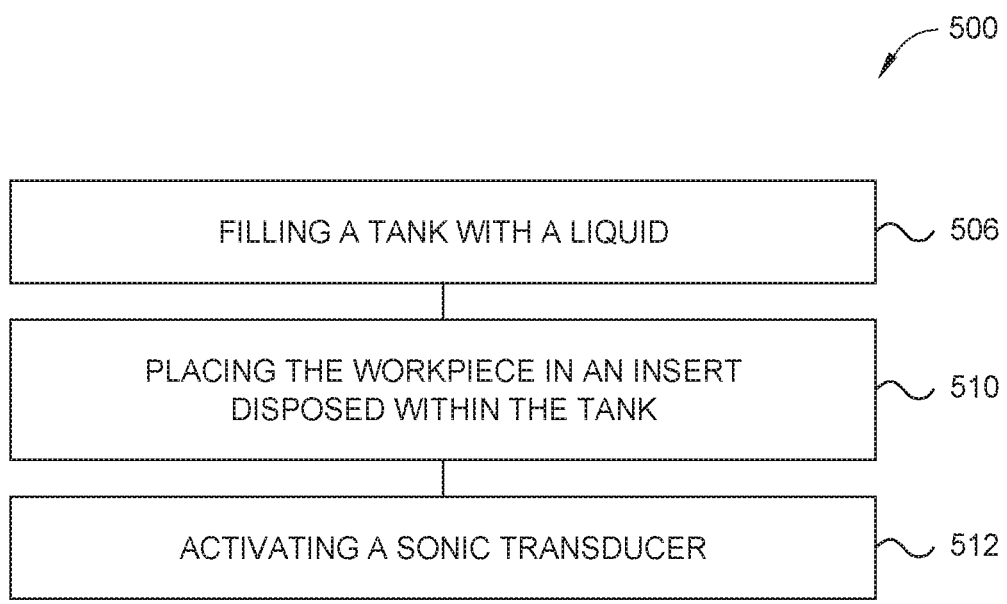
FIG. 5 illustrates a flow chart of method operations for sonic cleaning of a workpiece, according to one embodiment.

FIG. 5 illustrates a flow chart of method 500 operations for sonic cleaning of a workpiece, according to one embodiment. Although the method 500 operations are described in conjunction with FIGS. 1-5, persons skilled in the art will understand that any system configured to perform the method operations, in any order, falls within the scope of the embodiments described herein. The method 500 can be stored or accessible to a system controller (not shown) of the sonic cleaning system 100 as computer readable media containing instructions, that when executed by a processor of the system controller, cause the sonic cleaning system to perform the method. Any of the individual operations of method 500 can be performed in any of the tanks 104 of the sonic cleaning system 100 described above.

The method 500 begins at operation 506, wherein a tank (e.g., the tank 104A) is filled with a liquid (e.g., the liquid 440). The tank includes a sonic transducer (e.g., the sonic transducer 214) and an insert (e.g., the insert 130A).

At operation 510, a workpiece (e.g., the workpiece 218) is placed in the tank. The workpiece can be placed by any conventional method, such as by hand or by a mechanical device configured to place the workpiece.

At operation 512, the sonic transducer is activated to clean the workpiece. The sonic transducer can be de-activated once the cleaning is complete.

As described above, a sonic cleaning system includes one or more tanks filled with a liquid, wherein high frequency waves (e.g., sound waves) propagate through the liquid. One or more workpieces that are to be cleaned are placed into the liquid. A method of sonic cleaning a workpiece includes placing the workpiece in an insert disposed within a tank. High frequency sound waves are generated, such as by an ultrasonic transducer, and propagate through the liquid to the workpieces. The sound waves cause cavitation proximate the workpieces, which releases particles, such as dirt and grease, from the workpieces.

Corners of the tanks may attenuate or disperse the sound waves, which prevents the energy in the sound waves from reaching the workpieces, resulting in inefficient cleaning of the workpieces. However, the sonic cleaning system disclosed herein and reduces energy loss in the tanks by reflecting sound waves toward and/or focusing the sound waves on the workpieces, which improves the cleaning efficiency of the sonic cleaning system.

The foregoing description discloses only example embodiments. Modifications of the above-disclosed apparatus and methods which fall within the scope of this disclosure will be readily apparent to those of ordinary skill in the art.

What is claimed is:

1. A method for sonic cleaning of a workpiece, comprising:
   filling a tank with a liquid, wherein the tank comprises:
      a sonic transducer disposed on a transducer support located at a floor of the tank; and
      an insert that is cylindrical, wherein the sonic transducer is positioned partially within the insert;
   placing the workpiece in the insert; and
   activating the sonic transducer.

2. The method of claim 1, the sonic transducer is spaced a distance from the floor of the tank.

3. The method of claim 1, wherein placing the workpiece in the insert comprises suspending the workpiece in the insert.

4. The method of claim 1, wherein the tank comprises one or more walls, wherein the sonic transducer is mechanically isolated from the one or more walls and the floor of the tank.

5. The method of claim 1, wherein the insert has a first end with a first opening and second end with a second opening, the second end being opposite the first end, and the method further comprises locating the second end proximate to the floor of the tank.

6. The method of claim 5, wherein the workpiece is located in the first opening.

7. The method of claim 1, wherein the tank comprises three or more flat sheets that are fastened together.

8. The method of claim 7, wherein the three or more flat sheets comprise stainless steel.

9. A sonic cleaning system comprising:
   a tank configured to contain a liquid that enables propagation of sonic waves;
   a cylindrical insert disposed within the tank, the cylindrical insert including a first end having a first opening and a second end opposite the first end, the second end having a second opening, wherein the cylindrical insert is configured to receive a workpiece between the first opening and the second opening; and
   a sonic transducer disposed on a transducer support located at a floor of the tank so that the sonic transducer is positioned partially within the cylindrical insert.

10. The sonic cleaning system of claim 9, wherein the tank comprises three or more flat sheets that are fastened together.

11. The sonic cleaning system of claim 10, wherein the three or more flat sheets comprise stainless steel.

12. A sonic cleaning system, comprising:
   a tank configured to contain a liquid that enables propagation of sonic waves;
   an insert disposed within the tank, the insert including a first end having a first opening and a second end opposite the first end, the second end having a second opening, wherein the insert is round or oval when viewed from the first end and configured to receive a workpiece between the first opening and the second opening; and
   a sonic transducer disposed next to the second opening, wherein the sonic transducer is disposed on a transducer support located at a floor of the tank so that a space is formed between the sonic transducer and the floor of the tank, and the sonic transducer is positioned partially within the insert.

13. The sonic cleaning system of claim 12, wherein the second end of the insert is located a distance from the floor.

14. The sonic cleaning system of claim 12, wherein the insert is configured to suspend the workpiece within the insert.

15. The sonic cleaning system of claim 12, further comprising a support configured to suspend the workpiece within the insert.

16. The sonic cleaning system of claim 12, wherein the insert comprises a first material, wherein the first material reflects at least one of ultrasonic waves and megasonic waves.

17. The sonic cleaning system of claim 16, wherein the insert comprises stainless steel.

18. The sonic cleaning system of claim 12, wherein the tank comprises three or more flat sheets that are fastened together.

19. The sonic cleaning system of claim 18, wherein the three or more flat sheets comprise stainless steel.

* * * * *